United States Patent
Sachdev et al.

(10) Patent No.: US 6,652,665 B1
(45) Date of Patent: Nov. 25, 2003

(54) METHOD OF REMOVING SILICONE POLYMER DEPOSITS FROM ELECTRONIC COMPONENTS

(75) Inventors: Krishna G. Sachdev, Hopewell Junction, NY (US); Umar M. Ahmad, Hopewell Junction, NY (US); Chon C. Lei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/160,627

(22) Filed: May 31, 2002

(51) Int. Cl.$^7$ ................................................. B08B 3/10
(52) U.S. Cl. ............................. 134/26; 134/2; 134/19; 134/25.4; 134/25.5; 134/30; 134/32; 134/34; 134/35; 134/36; 134/42
(58) Field of Search ........................... 134/2, 19, 25.4, 134/25.5, 26, 30, 32, 34, 35, 36, 42

(56) References Cited

U.S. PATENT DOCUMENTS

| | | | |
|---|---|---|---|
| 3,673,099 A | 6/1972 | Corby et al. | 252/156 |
| 3,947,952 A | 4/1976 | Miller et al. | 29/578 |
| 3,969,813 A | 7/1976 | Minetti et al. | 29/575 |
| 4,089,704 A | 5/1978 | Heiss, Jr. et al. | 134/29 |
| 5,747,624 A | 5/1998 | Rubinsztajn et al. | 528/21 |
| 6,350,560 B1 * | 2/2002 | Sahbari | 430/325 |
| 6,372,410 B1 * | 4/2002 | Ikemoto et al. | 430/318 |

OTHER PUBLICATIONS

Pending U.S. patent application S/N 09/406,645 filed Sep. 27, 1999, Sachdev et al., "Removal of Cured Silicone Adhesive for Reworking Electronic Components".

* cited by examiner

*Primary Examiner*—Sharidan Carrillo
(74) *Attorney, Agent, or Firm*—James J. Cioffi

(57) ABSTRACT

A method of removing cured silicone polymer deposits from electronic components. The components are immersed in a preheated solution of a quaternary ammonium fluoride in a hydrophobic non-hydroxylic aprotic solvent with agitation. The components are then immersed in a preheated solvent consisting essentially of a hydrophobic aprotic solvent with agitation. This is followed by a rinse and spray of the components with a hydrophilic, essentially water soluble solvent, with agitation. The components are then immersed in a water bath and then rinsed with a pressurized spray of water and then dried with a $N_2$ blow dry.

20 Claims, 7 Drawing Sheets

METHOD OF REMOVING SILICONE POLYMER DEPOSITS FROM ELECTRONIC COMPONENTS

BACKGROUND OF THE INVENTION

This invention relates to a method of removing cured silicone polymer deposits from the surface of electronic components to provide product rework, recovery, and defect repair in microelectronics fabrication. The invention is particularly concerned with a novel and highly efficient method of removing cured Sylgard™ (Trademark of Dow Corning Corp.) and related elastomeric silicone adhesives from the surface of ceramics, metals, cured epoxy resins, and polyimides for reclamation and reuse of the recovered semiconductor assembly parts.

The present invention describes a new method of removing cured elastomeric silicone adhesive, particularly, Sylgard and related silicone polymers which are commonly used in electronic module assembly. Silicone polymers are widely used in microelectronics fabrication processes as sealants and adhesives. For example, one major application in non-hermetic ceramic module assembly includes Sylgard seal band attachment of a protective metal cap onto a ceramic chip carrier to provide protection of the semiconductor device against mechanical damage, moisture ingress, and environmental corrosion.

Other applications of the silicone polymers include: device encapsulation, top seal between the silicon device chip and the substrate to provide an α-particle barrier, passivation coatings on printed circuit boards, coatings on various metallic, plastic, and thermoplastic components to provide protection against mechanical and environmental damage, and use of conductive silicones to attach a heat spreader or a heat sink to the backside of a flip chip for heat dissipation. In addition, thermally and electrically conductive adhesives based on a silicone matrix in conjunction with various types of fillers such as silica, quartz, alumina, aluminum nitride, and metals such as Cu, Ag, Au, silver plated Al, In—Sn on Cu or Ni, and carbon black find applications as adhesives for direct attachment of heat sinks or heat slugs to device chips for heat dissipation and also as die bond adhesive in wire bonded packages. Commonly used heat slug materials include Al—SiC, anodized Al, SiC, metal matrix composite, Cu and Mo.

Microelectronics fabrication processes often require disassembly of assembled components. Typical reasons include carrying out diagnostic tests, to replace or repair the semiconductor device, or to recover electrically good substrates from test vehicles or early user hardware used to assess product performance and reliability prior to actual product release. Removal processes for various assembly materials must be selective for a particular material set and cause no detriment to the substrate integrity and electrical performance. It is also required that the removal method be environmentally and chemically suitable for use in a manufacturing environment.

Sylgard formulation is a primer-less organosiloxane based two component system comprising a vinyl-functionalized ($CH_2=CH-$) siloxane, typically vinyl-terminated-poly (dimethylsiloxane) as part A, and dihydro-dimethyl siloxane as part B, along with a curing catalyst and inorganic fillers such as silica and quartz. The adhesive composition is prepared by mixing the two components in a specified ratio and the mixture is de-aireated to remove any trapped air bubbles prior to dispensing on the components bonding sites.

The adhesive is applied onto the surfaces to be bonded and the component parts are aligned and assembled followed by curing up to 170° C. to 175° C. for 45 to 60 minutes or by stepwise cure up to 150° C. involving: (a) ramp from 25° C. to about 70° C. at 2 to 3° C./minute, hold for about 90 minutes, (b) ramp up to 150° C. at 2 to 3° C./minute and hold at 150° C. for about 30 minutes.

Equation (I) is an illustration of the Sylgard chemistry in terms of the reactive components and the curing reactions involved. The crosslinking reactions between the precursors are heat-accelerated resulting in a cured hydrophobic polymer of flexible/elastomeric matrix having special stress absorbing properties. These characteristic features of elastomeric silicones are particularly useful for providing protection from moisture ingress and maintenance of adhesive joints between diverse materials having different thermal coefficients of expansion (TCE) under high stress conditions during thermal cycling and other reliability stress test exposures.

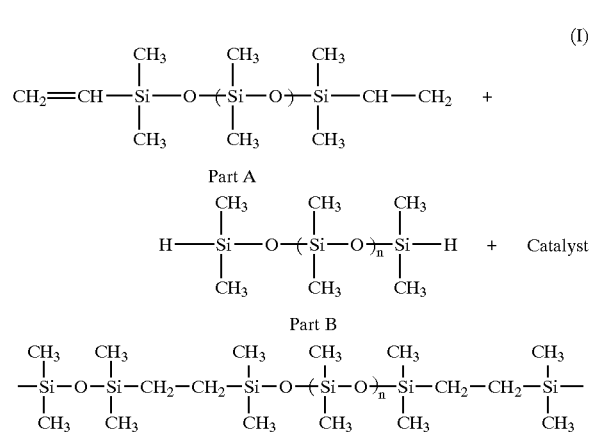

Thermally and electrically conductive silicones are obtained by incorporating conductive fillers such as alumina, silica, aluminum nitride, and metal powders or carbon black for electrical conductivity when necessary. Typically, the adhesive formulation comprises $Al_2O_3$ and $SiO_2$/quartz filled polydimethyl siloxane/dimethyl vinyl terminated glycidoxypropyl trimethoxy silane and dimethyl methyl hydrogen siloxane components and a curing catalyst. Electrically conductive alkyl silicone such as methyl silicone and fluorosilicone resins for bonding chips to lead frames may contain metal powder or metal coated inorganic or organic polymer particles.

A major problem in the use of crosslinked elastomeric silicone adhesives such as Sylgard in electronic assembly products has been the difficulty in removing the cured polymer material and obtaining residue-free surfaces for module assembly rework, repair of defective components, and for reuse or recycling of assembly parts. Among the various known methods for removing cured silicones, mechanical scraping of the bulk of the coating followed by media blast and water rinse using pressurized spray, is labor intensive and has additional problems of surface damage and incomplete removal which invariably requires an additional cleaning operation with organic solvents which again does not result in a silicone-free surface. Yet another problem is that it is limited to removal of flat or planar surface residues only.

Another method is the chemical-mechanical removal which is based on the use of a strongly alkaline solution comprising NaOH, KOH, or tetramethylammonium hydroxide (TMAH) in lower boiling alcohols such as methanol, isopropanol, or mixture thereof, which causes a base induced chemical degradation of a —Si—O—Si— chain resulting in removal/dissolution of silicone residue from surfaces. Use of a low boiling solvent with strong alkali has chemical safety and flammability issues. There are also concerns about the compatibility of component materials with such high pH aqueous or alcoholic alkaline environments. An alternate method employs organic solvents without any reactive reagent, typically, toluene, dichloromethane, or dimethylformamide, to cause swelling of the silicone polymer which can then be removed by peeling or other mechanical means. This method is not considered practical because of incomplete removal which also requires the manual operation of peeling off the swelled polymer and because the required solvents are unacceptable for industrial applications due to strict regulations on the use of such solvents arising from associated environmental and health issues.

There are a number of solutions proposed by others for stripping cured elastomeric silicone adhesives from various surfaces. Minetti et al. U.S. Pat. No. 3,969,813, the disclosure of which is incorporated by reference herein, describes a high pressure water jet technique to remove room temperature vulcanization (RTV) silicone encapsulant under the chip to lift off the chip by mechanical impact of a directed high pressure $H_2O$ jet stream at 12,000 to 20,000 psi pressure. This method, however, leaves silicone residue which is removed by subsequent solvent-based cleaning with isopropanol (IPA).

Corby, U.S. Pat. No. 3,673,099, the disclosure of which is incorporated by reference herein, describes a method for stripping cured silicones and vinyl polymers as polyvinyl cinnamates from substrates using an organic or inorganic base in N-methylpyrrolidone (NMP) with or without another solvent. Specific stripping compositions claimed to be effective for removing methyl-phenyl polysiloxane resins comprise guanidine carbonate or quaternary ammonium hydroxide in NMP and ethylene glycol monomethyl ether.

Miller et al. U.S. Pat. No. 3,947,952, the disclosure of which is incorporated by reference herein, describes a method of encapsulating beam lead semiconductor devices by a multi-step process including a step involving selective removal of an unmasked portion of a silicone resin through a resist mask. The disclosed stripping compositions are comprised of a tetramethyl ammonium hydroxide (TMAH) in 1:2 volume ratio of NMP and isopropanol (IPA) for removing exposed silicone resin after which the resist mask is removed exposing the remaining silicone resin film protection over active areas of the device.

Heiss et al. U.S. Pat. No. 4,089,704, the disclosure of which is incorporated by reference herein, describes a method for removing silicone rubber encapsulating material from microelectronic circuits using methanolic tetramethyl ammonium hydroxide (TMAH) in ethanol or isopropanol (IPA). Specific siloxane polymers are those with methoxy end groups which undergo curing reactions in the presence of moisture in air.

Rubinsztajn et al. U.S. Pat. No. 5,747,624, the disclosure of which is incorporated by reference herein, describes a process for removing silicone coatings and sealants in electrical devices using an M-rich silicone and a catalyst for degradation of polymerized silicones thereby enabling the removal of silicone conformal coatings from surfaces.

Cured organic silicone coatings are also known to be removed by spray solutions containing a 1:1 ratio of methylene chloride and Freon with less than 10% of ethanol addition. Various solvent-based stripping compositions used in the references cited above are not practical for use in manufacturing environment because of the following problems:

(a) Strongly alkaline solutions based on the use of very low boiling solvents such as methanol, ethanol, and isopropanol have the problem of flammability and chemical safety issues for use in manufacturing applications in addition to concerns for electronic component compatibility with high pH solution treatment. Also, these alcohols are classified as Volatile Organic Compounds (VOCs) which are subject to VOC regulations requiring strict control of air emissions by installing special control devices.

(b) Use of ethylene glycol ether solvents such as ethylene glycol monomethyl or ethylene glycol diethyl ether has become highly restricted in industrial processes due to associated human toxicity. This category of solvents are on the toxic release inventory (TRI) list which are subject to strict environmental regulations for hazardous air pollutants (HAPs).

(c) Chlorinated solvents such as methylene chloride are classified as HAPs and thus are under strict environmental regulations which has restricted their use in production processes in recent years. The fluorochlorocarbons or Freons are among the Ozone Depleting Solvents (ODS) which have been banned and their use has been phased-out.

Considering the problems in the prior art cited above on the stripping methods for cured elastomeric silicone adhesives from various surfaces of semiconductor device and packaging substrates, a need exists for an improved method of silicone polymer removal for rework/repair processes in microelectronics fabrication that does not have the problem of assembly components compatibility, environmental hazard, toxicity and flammability issues associated with the methods described in the prior art.

In view of the drawbacks in the silicone residue removal methods of the prior art, a need exists for an improved method in terms of providing more efficient and complete removal, preferably without requiring manual scrubbing or wiping, and which is based on neutral or mildly alkaline solution chemistry such that it is compatible with the various metals including solder alloys, polymers and inorganic materials used in the fabrication of electronic components.

It is therefore an object of the present invention to provide an improved method of removing crosslinked silicone polymers from electronic components for rework, to repair defects, and for reclamation or recovery of usable parts of the assembly products.

Another object of the present invention is to provide a method of removing silicone polymer residue for reclamation of expensive test vehicles which are currently discarded for lack of a suitable silicone residue removal process thereby adding to the overall cost of the product and increasing the waste volume and disposal cost.

A further object of the present invention is to provide an improved method for removing cured Sylgard deposits from various surfaces of electronic modules which is based on non-alkaline or mildly alkaline solution chemistry and which has no environmental and health hazard concerns, and no chemical safety or flammability issues for use in manufacturing operations.

Yet another object of the present invention is to provide an efficient method of removing Sylgard residue and related silicone polymer residues from electronic components which is compatible with a variety of material surfaces including Cu, Cr, Pb/Sn, lead-free solders, polyimide passivation coatings, cured epoxies, ceramic chip carriers and silicon device chips.

These and other purposes of the present invention will become more apparent after referring to the following description considered in conjunction with the accompanying drawings.

BRIEF SUMMARY OF THE INVENTION

The purpose and advantages of the present invention have been achieved by providing a method for removing silicone polymer deposits from electronic assembly component surfaces, interfaces, and under the chip regions of solder joined device to substrate pads, as for example, in the case of flip-chip bonding.

The method comprises the steps of:

(a) providing a first cleaning solution for silicone polymer removal which comprises a quaternaryammonium fluoride (QAF) compound dissolved in a first essentially water insoluble non-hydroxylic aprotic solvent;

(b) submerging the electronic components carrying silicone polymer residue/deposits in the first cleaning solution heated at 40 to 90° C., preferably 45 to 60° C. and allowing the components to be subjected to the cleaning action by the solution with stirring or agitation for a first predetermined period of time between about 10 to about 90 minutes, depending on the extent of polymer residue and the component surface topography;

(c) removing the assembly components from the first cleaning solution;

(d) transporting and submerging the components in the first solvent rinse bath which comprises a hydrophobic non-hydroxylic solvent, preferably the same solvent as used for the first cleaning solution, and subjecting the components to the solvent rinse, for example, immersion rinse at room temperature to 70° C. with agitation, for a second predetermined period of time between about 5 to about 15 minutes, to replace the cleaning solution on the component surface with the solvent;

(e) removing the components from the first solvent rinse bath;

(f) transporting and submersing the components to the second solvent rinse bath which comprises a hydrophilic essentially water soluble solvent, and subjecting the components or parts to the second solvent rinse at room temperature to about 60° C. with agitation such as stirring or immersion spray for about 5 to 10 minutes;

(g) removing the components from the second solvent rinse bath;

(h) transporting the components to an aqueous rinse bath and applying a water rinse, preferably deionized water rinse, for example, spray or immersion spray rinse, at room temperature to about 50° C. for 2 to 10 minutes;

(i) subjecting the components to an optional step of briefly rinsing with IPA (isopropanol) to replace water on the component surface with IPA to accelerate drying;

(j) drying the components by blowing dry $N_2$ or air on the surfaces and then heating the assembly components at about 90° C. to about 120° C. for 30 minutes to about one hour, preferably under vacuum to remove adsorbed moisture from the components.

In an alternative solvent rinse process, the assembly components or parts after the first solvent rinse in non-hydroxylic aprotic solvent such as propylene glycol methyl ether acetate (PMA), are transported to a second solvent bath also containing a hydrophobic non-hydroxylic solvent, preferably the same solvent as used for the first cleaning solution and the first rinse solvent such as PMA, and subjecting the parts to the second solvent rinse similar to the first solvent rinse. After the second solvent rinse, the assembly components are transported to a bath containing IPA where the parts are subjected to a spray rinse or immersion rinse with IPA to replace the PMA solvent with IPA, and then dried by blowing dry $N_2$ or air on the surfaces followed by heating the component parts at about 90° C. to about 120° C. for 30 minutes to one hour, preferably under vacuum.

The first essentially water insoluble non-hydroxylic aprotic solvent candidates of the first cleaning solution are in the category of propylene glycol alkyl ether alkoate selected from the group consisting of propylene glycol methyl ether acetate (PMA), propylene glycol methyl ether propionate (Methotate), di(propylene glycol) methyl ether acetate, ethoxy ethyl propionate (EEP), di(propylene glycol) dimethyl ether (DMM), and other related hydrophobic non-hydroxylated solvents.

The quaternary ammonium fluoride (QAF) compound in the first cleaning solution for silicone polymer removal is represented by a tetraalkylammonium fluoride compound based on the formula $R_1R_2R_3R_4N^+F^-$, where $R_1$, $R_2$, $R_3$, $R_4$ are the same or different and are selected from the group consisting of an organic radical $C_nH_{2n+1}$ where n=1–8, where the preferred candidates include tetrabutylammonium fluoride (TBAF), tetramethylammonium fluoride (TMAF), tetraethylammonium fluoride (TEAF), or tetra-n-octylammonium fluoride (TOAF).

The quaternary ammonium fluoride (QAF) used in the first cleaning solution can be in the form of a hydrate represented by $R_1R_2R_3R_4N^+F^-\cdot xH_2O$, where x=3–5, or it can be as an anhydrous solution in tetrahydrofuran (THF), where $R_1$, $R_2$, $R_3$, and $R_4$ are the same as represented by $R_4N^+F^-$, where R is a methyl, ethyl, n-propyl, isopropyl, n-butyl, or n-octyl, and combination thereof, or these are different and are selected from the group consisting of an organic radical $C_nH_{2n+1}$ where n=1–8. R is a methyl, ethyl, n-propyl, isopropyl, n-butyl, or n-octyl group.

The preferred quaternary ammonium fluoride (QAF) compound in the first cleaning solution is tetrabutylammonium fluoride (TBAF) which is present at a concentration of about 0.2 to 5 weight %, preferably 0.5 to 1% based on the formula $(C_4H_9)_4N^+F^-$, or 0.6 to 1.5% (weight %) as the trihydrate (TBAF.$3H_2O$) in hydrophobic aprotic solvent, preferably propylene glycol methyl ether acetate (PMA).

The first solvent rinse bath comprising a non-hydroxylic aprotic solvent which is preferably the same solvent as in the first cleaning solution solvent in the category of propylene glycol alkyl ether alkoate selected from the group consisting of propylene glycol methyl ether acetate (PMA), propylene glycol ethyl ether acetate (PGEEA, bp. 158° C.), propylene glycol methyl ether propionate (methotate), di(proylene glycol) methyl ether acetate (DPMA, bp. 200° C.), ethoxy ethyl propionate (EEP), and di(propylene glycol) dimethyl ether (DMM, bp. 175° C.).

The second rinse solvent is a hydrophilic essentially water soluble solvent represented by propylene glycol alkyl ethers selected from the group consisting of di(propylene glycol) methyl ether (DPM, fp 75° C.), tri(propylene glycol) monomethyl ether (TPM, fp 96° C.), tri(propylene glycol) n-propyl ether, or a mixture thereof, used at a temperature from about room temperature to about 60° C.

In the alternative solvent rinse process, the parts after the first solvent rinse in PMA or related non-hydroxylic aprotic solvent are again subjected to the same solvent rinse, preferably PMA in a second solvent bath followed by spray or immersion rinse in IPA, and dried by blowing dry $N_2$ or air on the surfaces followed by heating the component parts at about 90° C. to about 120° C. for 30 minutes to one hour, preferably under vacuum. In this process, no hydrophilic solvent or water rinse is used.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
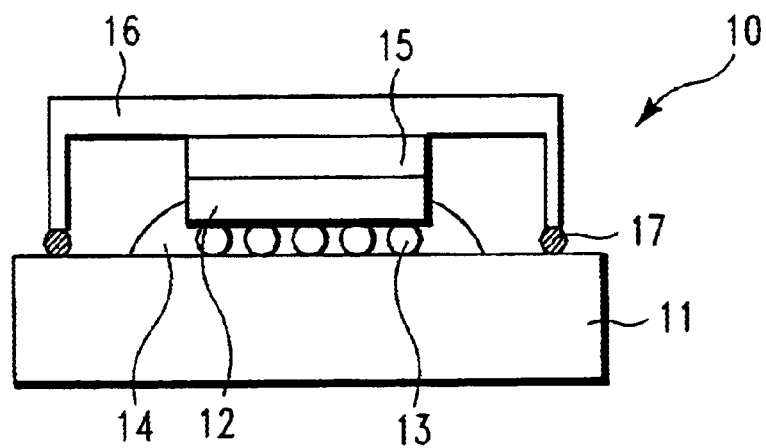
FIG. 1 shows a conventional single chip module (SCM) having a ceramic chip carrier or substrate with a single chip attached through solder joints encapsulated with epoxy encapsulant, a thermal compound dispensed over the chip for cooling, and a metal cap for device protection which is bonded to the substrate through a silicone polymer adhesive seal band at the perimeter.

The purposes of the present invention have been achieved by providing, according to the present invention, an improved method for removing cured silicone polymer deposits from surfaces of electronic modules.

The present invention is generally concerned with an improved method of removing Sylgard adhesive and related cured silicone polymer deposits from the ceramic and metal surfaces of electronic modules to provide an efficient and more viable option for rework in microelectronic assembly processes. These processes include diagnostic tests, product defect repair, and recovery of expensive protective caps and high density ceramic electronic modules thereby providing product cost reduction and waste minimization. They also assure reliable functional performance of the product. The invention is particularly concerned with removing cured Sylgard residue from ceramic electronic modules including single chip modules (SCMs) and multi chip modules (MCMs), and from the seal band areas in non-hermetic electronic packages where it is used to attach a metal cap to a substrate for protection against mechanical damage, moisture ingress and corrosion from exposure to the environment.

According to this invention cured Sylgard residue, on the seal band region of a ceramic substrate and the protective cap after the cap is detached from the substrate, is readily removed when the disassembled cap and ceramic module are subjected to a stirred solution of 0.2 to 5.0% (wt. %) quaternary ammonium fluoride (QAF) in a hydrophobic non-hydroxylic aprotic solvent at a temperature ranging from room temperature to about 90° C. by immersion followed by solvent rinse to remove the solution carry-over and final rinse with water or with alcohol, for example IPA. The disclosed method can also be used to disassemble the protective cap and chip carrier assembly without prior mechanical detachment followed by the complete removal of the silicone deposit by extended treatment of the assembly in the solution containing QAF.

The stripping compositions according to this invention consist of a quaternary ammonium fluoride in a hydrophobic non-hydroxylic aprotic solvent selected from the group consisting of, propylene glycol methyl ether acetate (PMA), propylene glycol methyl ether propionate (Methotate), di(propylene glycol) methyl ether acetate (DPMA), ethoxy ethyl propionate (EEP), di(propylene glycol) dimethyl ether (DMM), and other related hydrophobic non-hydroxylated aprotic solvents. Various quaternary ammonium fluoride reagents that can be used according to this method include tetraalkyl ammonium fluorides of the type $R_4N^+F^-$, where R is selected from the group consisting of an organic radical $C_nH_{2n+1}$, where n=1–8, preferably n=1–4 such that R can be methyl, ethyl, propyl, or butyl groups.

According to the present invention, it has been found that cured silicone polymer residue or deposit such as Sylgard adhesive layer can be readily removed from ceramic and metal surfaces by exposing the silicone residue carrying component parts to a solution of 0.2–5%, preferably, 0.5–2% (wt. %) of a quaternary ammonium fluoride (QAF), for example, tetrabutyl ammonium fluoride (TBAF) in a hydrophobic non-hydroxylic aprotic solvent, such as propylene glycol methyl ether acetate (PMA or PM-acetate or PGMEA, bp. 145–146° C.), propylene glycol methyl ether propionate (Methotate), or di(propylene glycol) dimethyl ether (DMM), or mixtures thereof, at 40–90° C., preferably at 50–60° C., by immersion for about 10 minutes to about 90 minutes or a pre-determined time period depending on the residue thickness and the type of surface, followed by the rinsing steps. It is found that immersion in the QAF, for example, TBAF containing solution, causes rapid disruption/disintegration of the polymer matrix and mostly removes it by dislodging it from the surface and, to a large extent, dissolution of the silicone residue.

The parts are then subjected to a solvent immersion treatment, preferably in the same solvent as used in the solution, for example, PM-acetate when PM-acetate/TBAF solution is used in the first step, to remove the solution from the component surface. This is followed by a thorough rinse with a lower boiling solvent, for example, IPA to replace the PM-acetate from the components surface followed by drying with $N_2$ or air flow. Alternatively, after the first step of removing silicone adhesive, parts are subjected to a few minutes of immersion treatment in a water soluble solvent to replace the solution with a hydrophilic, essentially water soluble solvent. This is followed by a thorough rinse with deionized water, preferably using a spray to dislodge any loose particles on the components surface, and finally rinsed with an optional IPA and $N_2$ dry.

The method disclosed according to this invention for removing cured silicone polymer deposits from electronic components can be used for rework, repair, or component recovery processes requiring removal of the protective cap or lid or hat, metal heat sink or metal plate attached to the substrate or module using insulative or conductive silicone adhesive. The disclosed invention is a highly efficient and effective method for removing silicone polymers such as Sylgard™ from a variety of surfaces of varying topography including planar and non-planar surfaces of metal protective caps, ceramic substrates, silicon, metals, cured epoxy resins and polyimides, as well as relatively thick deposits in narrow metal trenches.

The new method of silicone adhesive removal to provide residue-free surfaces can be applied to both the single chip (SCM) or multi-chip module (MCM) assemblies. FIGS. 1–10 illustrate the various module assemblies where Sylgard and related silicone elastomeric sealants are utilized.

Figure 11:
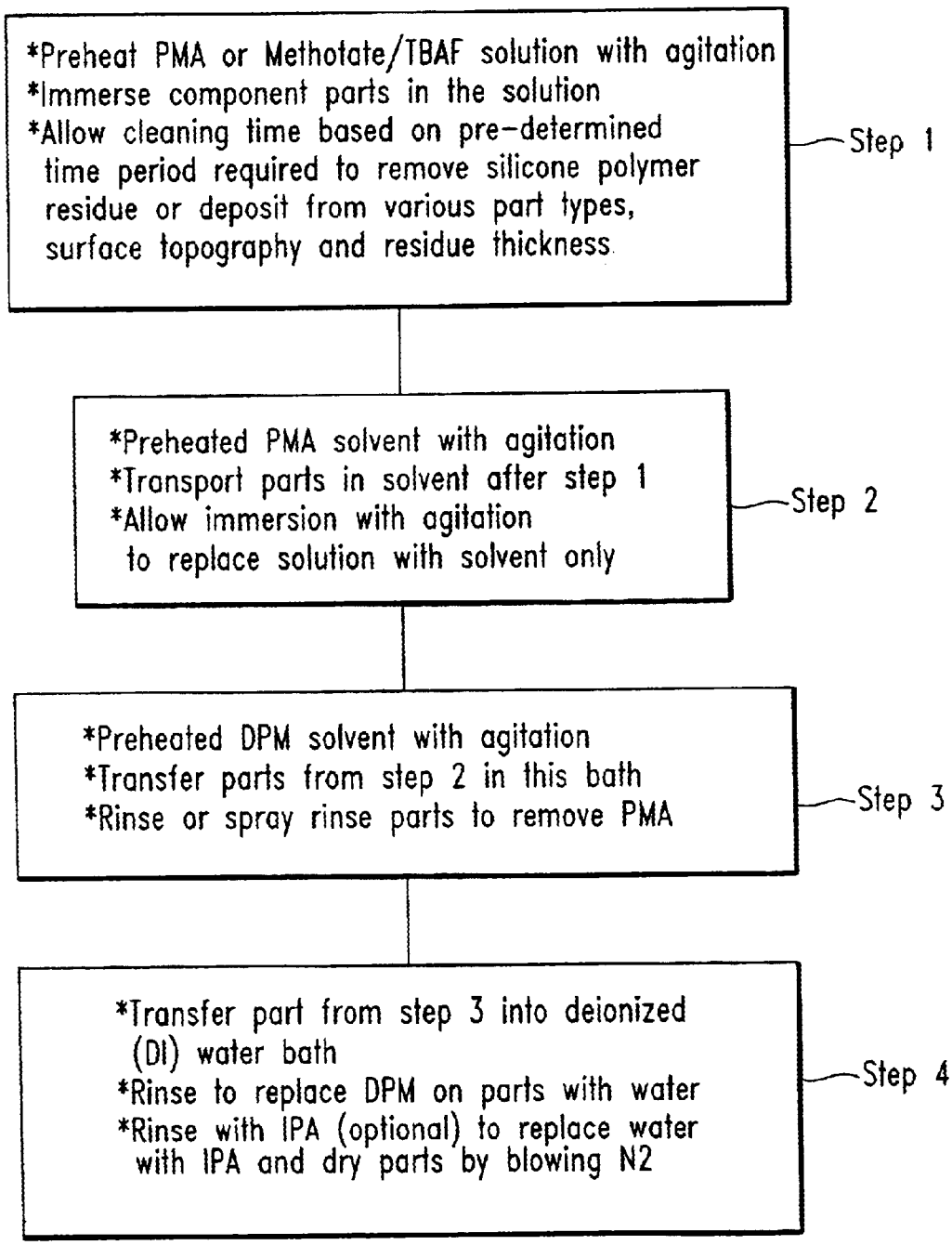
FIG. 11 is a process flow illustrating a first representative method for removing cured silicone deposits from electronic components.
Figure 12:
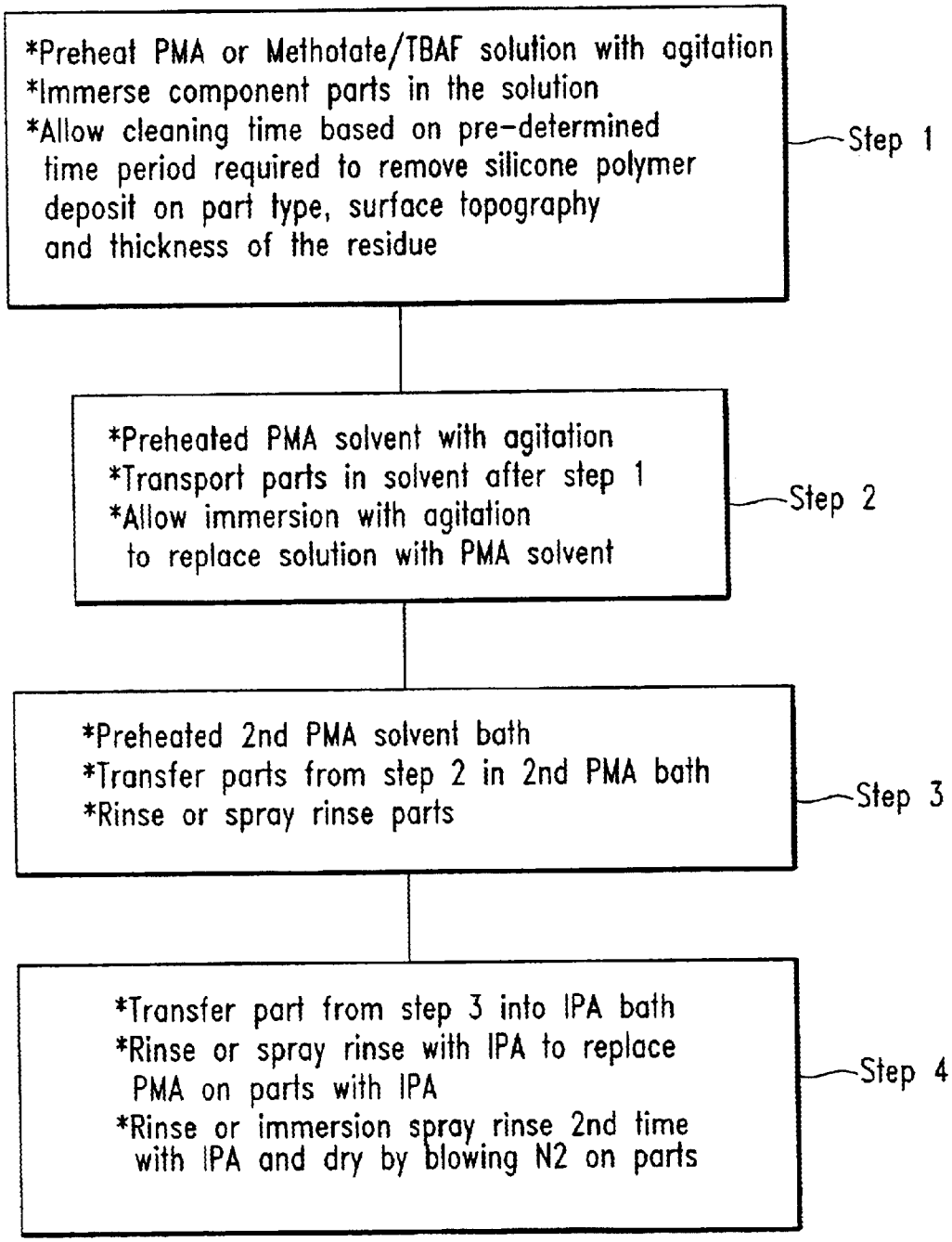
FIG. 12 is a process flow illustrating a second representative method for removing cured silicone deposits from electronic components.

Referring to FIGS. 11 and 12 there is shown representative process schemes for the sequence of steps involved in the two methods of removing Sylgard deposits from electronic assembly components according to this invention.

Other representative hydrophobic non-hydroxylic solvents that can be used in place of PM-acetate are selected from the group consisting of propylene glycol alkyl ether alkoate include: propylene glycol ethyl ether acetate (PGEEA, bp. 158° C.), propylene glycol methyl ether propionate (Methotate), di(propylene glycol) methyl ether acetate (DPMA, bp. 200° C.), ethoxy ethyl propionate (EEP), di(propylene glycol) dimethyl ether (DMM, bp. 175° C.), and other related hydrophobic aprotic solvents.

Various quaternary ammonium fluoride (QAF) candidates which have been found suitable for the purpose of this invention include a solid tetraalkyl ammonium fluoride represented by $R_1R_2R_3R_4N^+F^-xH_2O$ and an anhydrous solution in tetrahydrofuran (THF), for example, 1M solution of tetrabutylammonium fluoride (TBAF) in THF is commonly available, where $R_1$, $R_2$, $R_3$, $R_4$ are the same or different and are selected from the group consisting of an organic radical $C_nH_{2n+1}$ with n=1–8. Preferred candidates in this category include TBAF, tetramethylammonium fluoride (TMAF), tetraethylammonium fluoride (TEAF), tetraisopropylammonium fluoride, tetra-n-octylammonium fluoride (TOAF), and mixtures thereof.

The quaternary ammonium fluoride component in the removal of cured Sylgard from components according to this invention may be in the range 0.2 to about 5% (wt %) based on the formula $R_1R_2R_3R_4N^+F^-$ for the anhydrous material, preferably in the range from about 0.5 to about 2% by weight. Various quaternary ammonium fluoride candidates listed above are available from commercial sources as solid hydrates such as tetrabutylammonium fluoride hydrate ($Bu_4N^+F^-.xH_2O$) and also as anhydrous solutions such as 1M solution of $Bu_4N^+F^-$ in THF.

Various hydrophilic solvents that are preferred for use in the second step to replace the stripping solution carry-over on the electronic components have a high flash point (fp) preferably above 100° F., have low vapor pressure, and partial to complete solubility in water. It is also preferred that these solvents are non-toxic, have no chemical safety and environmental or health concerns, and are commercially available at low cost. Representative candidates in this category for the purpose of this invention include: propylene glycol alkyl ethers, particularly, di(propylene glycol) methyl ether (DPM, fp 75° C.), or tri(propylene glycol) monomethy ether (TPM, fp 96° C.), tri(propylene glycol) n-propyl ether, or a mixture thereof.

As an example of the rework process to remove cured Sylgard residue from the seal band region of a ceramic substrate and the protective cap after the cap (or hat) is detached from the substrate, the cap and the ceramic substrate (or module) are immersed in a constantly stirred solution of 0.5–2% (wt. %) quaternary ammonium fluoride in essentially water insoluble non-hydroxylic aprotic solvent at 40–90° C., preferably at 45–60° C. for 10 minutes to about 90 minutes or a predetermined time period, followed by immersion in a solvent only bath to remove the solution carry-over and final rinse with water or with alcohol, for example IPA.

The method of cured silicone adhesive removal to provide residue-free surfaces which is essentially based on a chemical action requiring a minimum mechanical action can be applied to both the single-chip module (SCM) or multi-chip module (MCM) assemblies where the solder joints used in the attachment of the silicon chip to ceramic chip carrier substrate can be with or without the presence of epoxy encapsulant. FIGS. 1–10 illustrate the various module assemblies where Sylgard or related elastomeric silicone adhesives are typically utilized.

Figure 2:
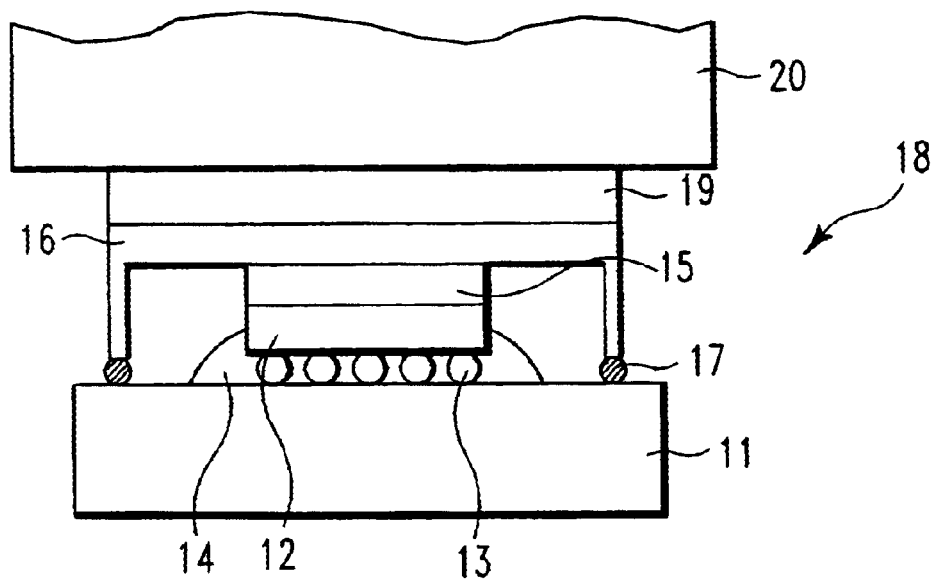
FIG. 2 shows a conventional single chip module assembly as in FIG. 1 but having a heat sink or heat slug attached to the protective cap with a thermally conductive silicone adhesive.

FIG. 1 shows a typical single chip module 10 having a ceramic chip carrier or substrate 11 with a single chip 12 attached through solder joints 13. An epoxy encapsulant 14 is typically used to encapsulate the solder joints. A thermal compound 15 is dispensed on the back side surface of the chip 12 for heat dissipation or cooling. A metal cap 16 contacts the thermal compound 15 and is used for device protection and is bonded to the substrate 11 through a silicone polymer adhesive seal band 17 at the perimeter. FIG. 2 shows a conventional single chip module assembly as in FIG. 1 but additionally shows a heat sink or heat slug 20 attached to the protective cap 16 with a thermally conductive silicone adhesive 19.

Figure 3:
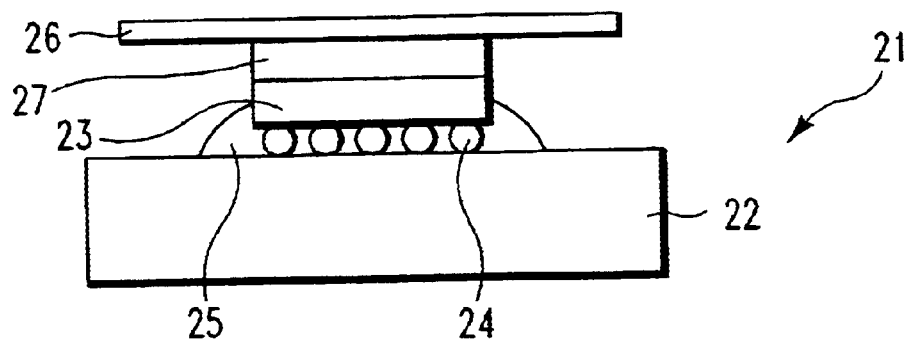
FIG. 3 shows a conventional single chip module as in FIG. 1 with a metal plate bonded to the chip with a silicone polymer adhesive.
Figure 4:
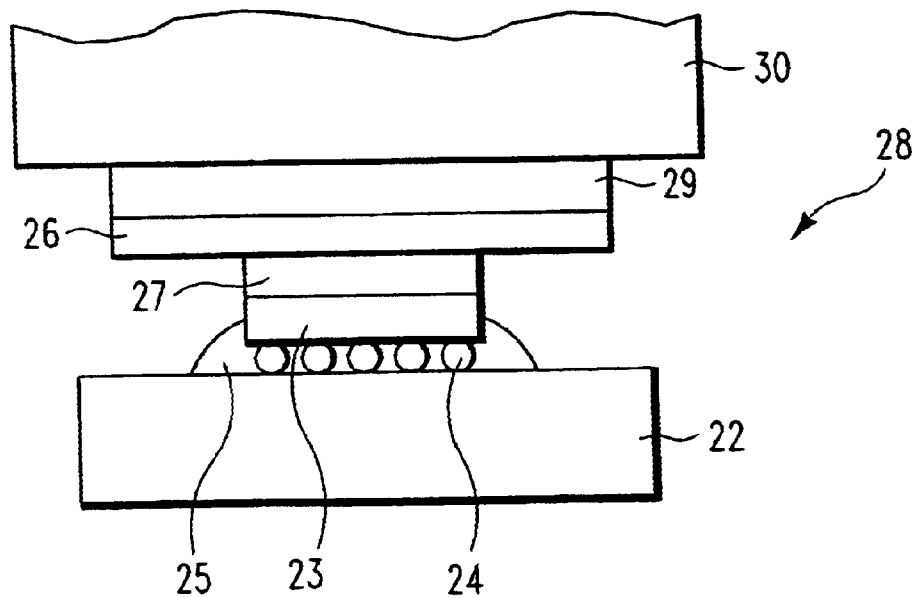
FIG. 4 shows a conventional single chip module as in FIG. 3 where a thermally conductive silicone adhesive is used to attach a metal heat sink to the metal plate and the metal plate to the chip.

FIG. 3 shows a conventional single chip module as in FIG. 1 represented as 21. Thus, a ceramic chip carrier or substrate 22 with a single chip 23 attached through solder joints 24 is shown with the solder joints being encapsulated with an epoxy encapsulant 25. A metal plate 26 is bonded to the silicon chip 23 with a silicone polymeric adhesive 27. FIG. 4 shows a single chip module assembly as in FIG. 3 generally as 28. The metal plate 26 of the chip assembly is shown attached to a metal heat sink 30 with a thermally conductive silicone polymer adhesive 29.

Figure 5:
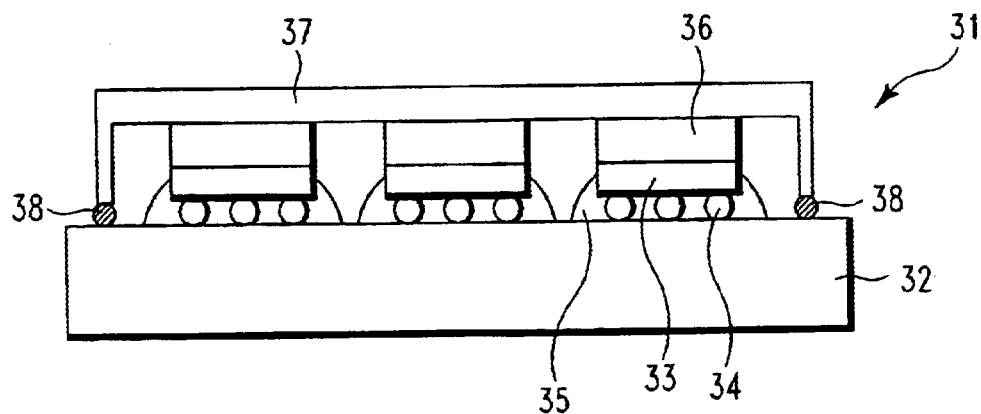
FIG. 5 shows a conventional multi-chip module (MCM) with the conventional protective cap attached to the chip carrier with a silicone polymer adhesive.
Figure 6:
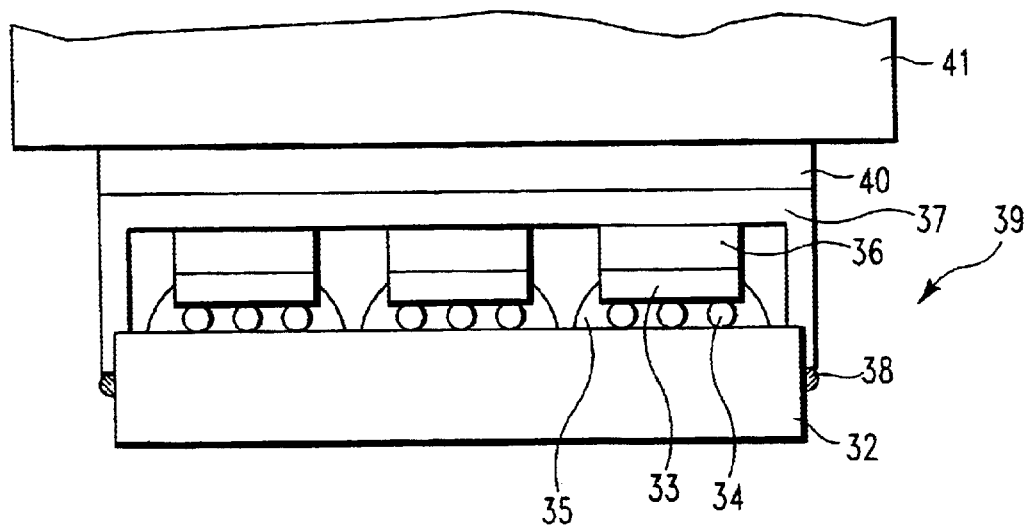
FIG. 6 shows a conventional MCM having a metal heat sink attached to the protective cap with a thermally conductive silicone adhesive having conductive filler.

FIG. 5 illustrates a typical multi-chip module (MCM) generally as 31 wherein a ceramic chip carrier substrate 32 is connected to a plurality of chips 33 through solder joints 34 with at the epoxy encapsulant 35 covering the solder joints. A thermal paste or compound 36 is shown on the back side surface of silicon chips 33 for cooling or heat dissipation. A protective cap 37 is shown attached to chip carrier 32 with a silicone polymer adhesive 38. FIG. 6 is an illustration of the MCM of FIG. 5 shown generally as 39 having a metal heat sink 41 attached to the protective cap 37 with a thermally conductive silicone adhesive 40 carrying conductive filler.

Figure 7:
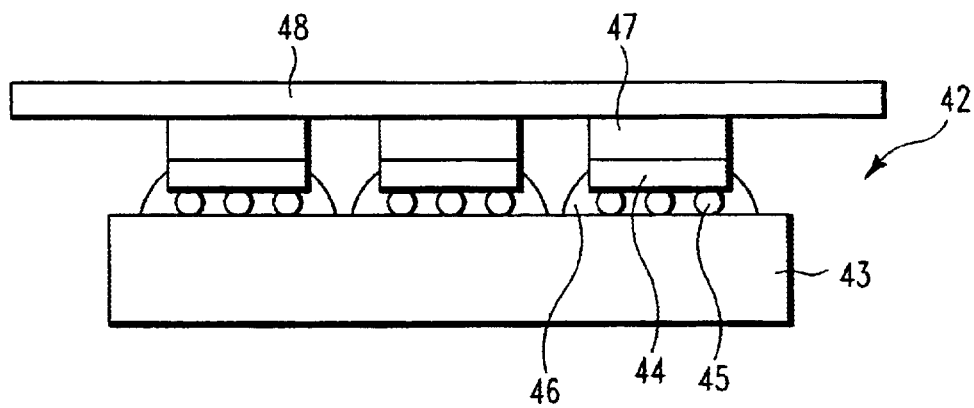
FIG. 7 shows a conventional multi-chip module where a metal plate for heat dissipation is directly attached to the back side of the chip with a silicone polymer adhesive.
Figure 8:
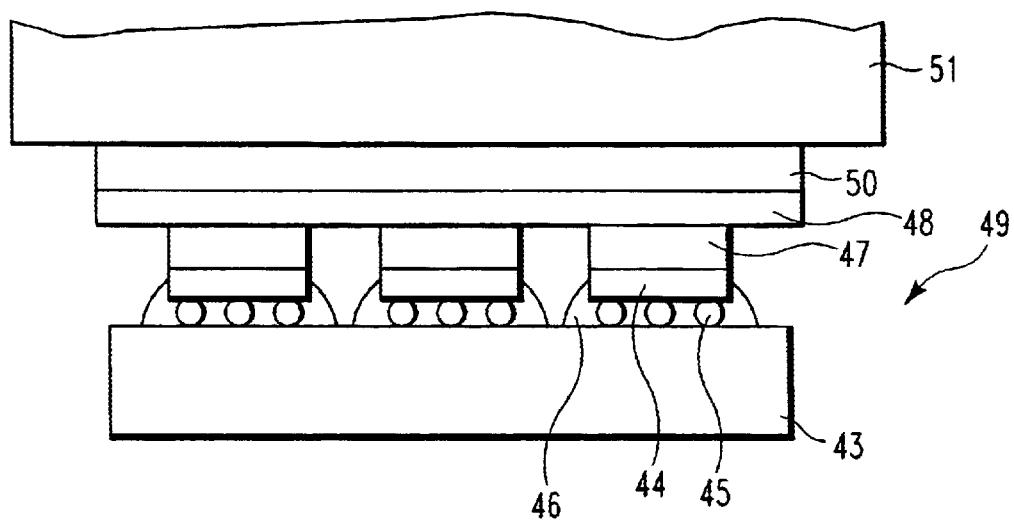
FIG. 8 shows the conventional multi-chip module of FIG. 7 wherein a metal heat sink is attached to the metal plate with a thermally conductive silicone polymer adhesive and the metal plate itself is directly attached to the silicon device chip with a silicone polymer adhesive.

FIG. 7 is a representation of a multi-chip module shown generally as 42 having a ceramic chip carrier 43 attached to a plurality of silicon chips 44 through solder joints 45 with an epoxy encapsulant 46 covering the solder joints. A silicone polymer adhesive 47 is used to attach the chips 44 to a metal plate 48 which is typically used for heat dissipation. FIG. 8 shows the MCM of FIG. 7 generally as 49 and further includes a metal heat sink 51 attached to metal plate 48 by a thermally conductive silicone adhesive 50.

Figure 9:
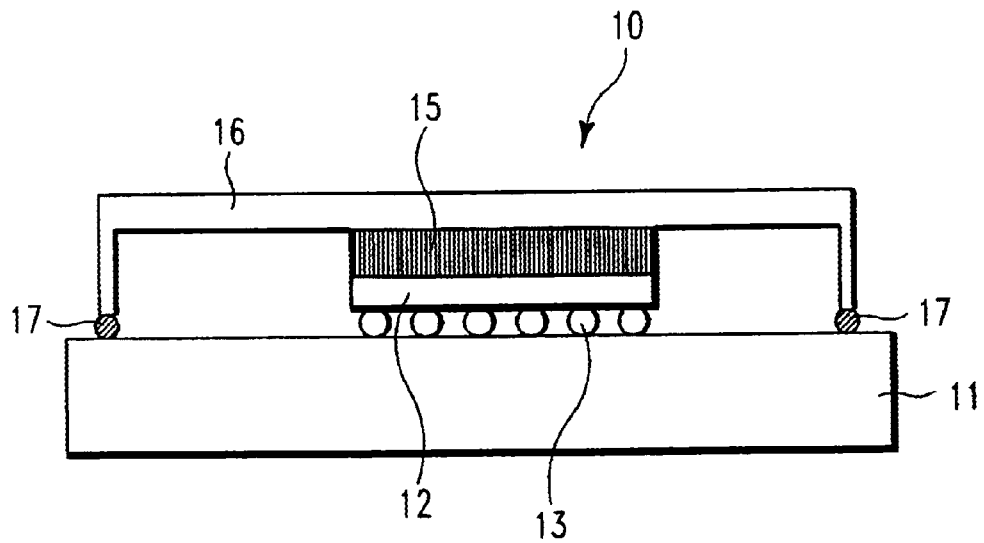
FIG. 9 shows a conventional single chip module (SCM) having a ceramic chip carrier or substrate with a single chip attached through solder joints which are not encapsulated, a thermal compound dispensed over the chip for cooling, and a metal cap for device protection which is bonded to the substrate through a silicone polymer adhesive seal band at the perimeter.

FIG. 9 shows a typical single-chip module (SCM) 10 having a ceramic chip carrier or substrate 11 with a single chip 12 attached through solder joints 13 which are not encapsulated. A thermal compound 15 is dispensed on the back side surface of the chip 12 for heat dissipation or cooling. A metal cap 16 contacts the thermal compound 15 and is used for device protection and is bonded to the substrate 11 through a silicone polymer adhesive seal band 17 at the perimeter.

Figure 10:
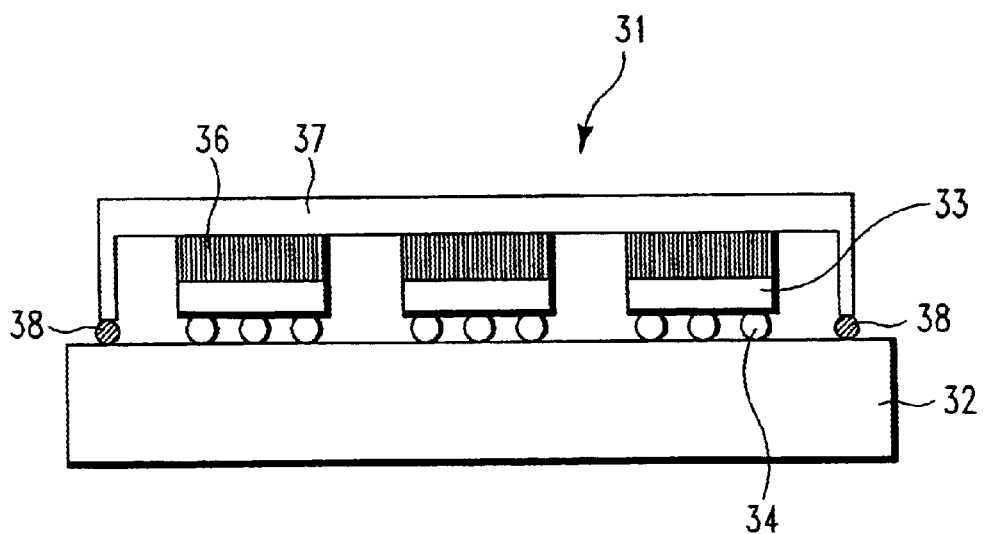
FIG. 10 shows a conventional multi chip module (MCM) having a ceramic chip carrier with a plurality of chips attached through solder joints which are not encapsulated, a thermal compound dispensed over the chips for cooling, and a conventional protective cap attached to the chip carrier with a silicone polymer adhesive.

FIG. 10 illustrates a typical multi-chip module (MCM) generally as 31 wherein a ceramic chip carrier substrate 32 is connected to a plurality of chips 33 through solder joints 34 which are not covered by epoxy encapsulant. A thermal paste or compound 36 is shown on the back side surface of silicon chips 33 for cooling or heat dissipation. A protective cap 37 is shown attached to chip carrier 32 with a silicone polymer adhesive 38.

The following examples are representative of the method of practicing the silicone adhesive removal processes according to FIG. 11 and FIG. 12.

Referring to FIG. 11 there is described a first example of the removal of cured Sylgard deposit reside on the protective metal cap or hat and the ceramic chip carrier after detachment from a SCM or MCM module assembly. A solution containing tetrabutylammonium fluoride (TBAF) in a hydrophobic aprotic solvent, for example propylene glycol methyl ether acetate (PMA) or propylene glycol methyl ether propionate (Methotate) is prepared by dissolving 12 g of TBAF hydrate (TBAF.3H$_2$O) in one liter of the solvent in a stainless steel beaker and the solution is heated to a temperature of about 45° to about 60° C., typically to about 50–55° C. with agitation, for example using a bar magnet.

The detached metal cap and/or the ceramic chip carrier, from which any adhering thermal compound has already been removed, and having only the Sylgard deposit at the seal band regions, are immersed in the constantly stirred solution for 15 minutes to 35 minutes. During this time, the silicone residue essentially dissolves and is mostly removed leaving traces of the inorganic filler component of the Sylgard composition on some areas of the component surface. The parts are then transported in to the second bath as in step 2, preferably containing the same solvent as the solvent used to make up the solution for step 1, which solvent is also preheated to a temperature of about 40–55° C. with constant agitation.

After about 5 to about 10 minutes of being subjected to the solvent treatment, the parts are transferred to a third bath as in step 3, containing a hydrophilic, essentially water soluble solvent, such as di(propylene glycol) monomethyl ether (DPM) at room temperature or preferably, it is heated to about 45–60° C., and rinsed for about 5–15 min to remove the solvent carry-over on the parts from step 2. After treatment with the hydrophilic solvent in step 3, the parts are subjected to the rinse cycle of step 4 with water, preferably deionized water (DI water) using pressurized spray to wash off DPM from the parts. After the water rinse, the parts are optionally rinsed with IPA to accelerate drying, dried by blowing dry N$_2$, and can also optionally be subjected to vacuum bake.

Visual and microscopic examination of the surface of the ceramic substrate and the metal cap after the above cleaning process showed no evidence of any Sylgard residue. A water contact angle test with the cleaned surfaces showed the surfaces to readily wet by water. This is indicative of complete removal of hydrophobic silicon film. Quantitative and semi-quantitative analysis of the metal cap surfaces using x-ray photoelectron spectroscopy (XPS) showed complete absence of Si signals.

For a functional test, the reworked substrate and the protective cap were rebonded by applying the Sylgard adhesive composition onto the bonding surfaces at the seal band areas of the two parts. The parts were aligned, assembled and the adhesive cured by subjecting the assembly to thermal curing temperatures, for example, at 170–175° C. for about 45–60 min. Shear strength measurements according to a standard tensile pull test showed high shear strength with no significant difference from the shear strength obtained with the assembly using new ceramic substrate or chip carrier and the metal protective cap.

In a second example of the removal of cured Sylgard according to the process as described in FIG. 11 a disassembled MCM protective metal hat was used. The hat, having a Cr plated surface, had uneven surface topography with heavy deposits of silicone adhesive at the seal band areas and also having such deposits entrenched in grooves in certain regions. A solution containing tetrabutylammonium fluoride (TBAF) in propylene glycol methyl ether acetate (PM-acetate) was prepared by dissolving 15 g of TBAF hydrate (Bu$_4$N$^+$F$^-$.4H$_2$O) in one liter of PM-acetate solvent in a stainless steel beaker and the solution was heated to a temperature of about 50° C. to about 60° C. with agitation example using a stir bar magnet.

The detached hat having the Sylgard deposit at the seal band surface region, as well as filled in narrow trench at the perimeter of the bonding areas, was immersed in the constantly stirred solution for about 40 minutes to about 70 minutes. The silicone residue was mostly removed by dissolution and dislodging from the surface while leaving some of the affected adhesive and the inorganic filler component as white residue on the surface. The hat was then transported in to the second bath containing PM-acetate (PMA) as shown in step 2, which was also preheated to a temperature of about 45–55° C. with constant agitation. After about 7–15 minutes, the hat was transferred to a third bath as in step 3 containing di(propylene glycol) monomethyl ether (DPM), a hydrophilic essentially water soluble solvent, at room temperature or preferably, it is heated to about 45–60° C., and the hat is subjected to 10–20 min to remove the PM-acetate solvent carry-over on the parts from step 2 of the process described in FIG. 11.

After the DPM treatment (step 3), the Cr plated metal hat is subjected to the rinse cycle of step 4 with water, preferably deionized water (DI water) using pressurized spray to wash-off DPM. After the water rinse, the metal hat is optionally rinsed with IPA to accelerate drying, dried by blowing dry $N_2$, and subjected to vacuum bake if desired before reusing.

Visual and microscopic examination of the surface of the metal hat after being subjected to the above cleaning process showed no evidence of any Sylgard residue. A water contact angle test with the cleaned surfaces showed the surfaces to readily wet by water. This is indicative of complete removal of hydrophobic silicon film. Quantitative and semi-quantitative analysis of the metal cap surface using x-ray photoelectron spectroscopy (XPS) showed complete absence of Si signals.

For a functional test, the reworked protective cap was re-bonded with a ceramic substrate by applying the Sylgard adhesive composition onto the bonding surfaces at the seal band areas of the two parts. The parts were aligned and assembled, and the adhesive was cured by subjecting the assembly to thermal curing temperatures, for example, at 170–175° C. for about 45–60 minutes. Shear strength measurements according to a standard tensile pull test showed high shear strength with no significant difference from the shear strength obtained with the assembly using a new cap or hat.

Referring now to FIG. 12 there is described a third example of the removal of cured Sylgard. A disassembled SCM ceramic substrate or chip carrier, where any adhering thermal compound on the back side of the still attached chips had already been cleaned off, and having silicone adhesive at the seal band region, was used. A solution containing tetrabutylammonium fluoride (TBAF) in propylene glycol methyl ether acetate (PMA) was prepared by dissolving 12 g of TBAF hydrate ($Bu_4N^+F^-.3H_2O$) in PM-acetate in a stainless steel bath and the solution was heated to a temperature of about 50° C. to about 55° C. with agitation, for example, using a stir bar magnet. The ceramic substrate, or a chip carrier, having a single chip attached through solder joints which are covered by an epoxy encapsulant, and having the Sylgard deposits at the seal band surface at the perimeter, is immersed in the constantly stirred solution for 15–25 minutes whereby the silicone residue essentially dissolves leaving an essentially residue-free substrate surface.

The substrate is then transported, in step 2, to a bath containing PM-acetate which is preheated to a temperature of about 40–55° C. with constant agitation. After about 5–10 minutes, the substrate is then transported in step 3 to a second bath containing PM-acetate which is also preheated to a temperature of about 40–55° C. with constant agitation. After about 5–10 minutes the substrate is rinsed or sprayed and the substrate is then transferred to another bath as in step 4. This bath contains IPA at room temperature in which the substrate is subjected to about 5–10 minutes of immersion rinse or spray rinse to replace the PM-acetate solvent carry-over with IPA. After the first IPA rinse, the ceramic substrate is subjected to a second rinse cycle with IPA by spray or immersion spray followed by drying with $N_2$, and vacuum bake if desired before reuse.

Visual and microscopic examination of the substrate surface of after subjecting to the above cleaning process showed no evidence of any Sylgard residue. A water contact angle test with the cleaned surface showed the surface to readily wet by water which is indicative of complete removal of hydrophobic silicon film.

For a functional test, the reworked ceramic substrate was assembled with a metal protective cap by applying the Sylgard adhesive composition onto the bonding surfaces at the seal band areas of the two parts following which the parts are assembled and the adhesive is cured by subjecting the assembly to the thermal curing temperature, for example, at 170–175° C. for about 45–60 min. Shear strength measurements according to a standard tensile pull test showed high shear strength with no significant difference from the shear strength obtained with the assembly using new substrate.

In a fourth example of the removal of cured Sylgard and related cured silicone polymer residues according to the method of this invention, a disassembled multi-chip module (MCM) substrate or chip carrier, having four chips attached through solder joints as in flip-chip bonding without epoxy encapsulant coverage of the solder joints, and where any adhering thermal compound on the back side of the chips had already been cleaned off, and having Sylgard adhesive deposits in the seal band region, was used.

A solution containing tetrabutylammonium fluoride (TBAF) in propylene glycol methyl ether propionate (Methotate) was prepared by mixing about 38 ml of 1M solution of TBAF in tetrahydrofuran (THF) in one liter of Methotate solvent in a stainless steel beaker. The solution was heated to a temperature of about 50–55° C. with agitation, for example, using a stir bar magnet.

The ceramic substrate or chip carrier, having a plurality of chips attached through solder joints which are not covered with an epoxy encapsulant, and having the Sylgard deposits at the seal band surface at the perimeter, is immersed in the constantly stirred solution for 20–35 minutes. During this time, the silicone residue on the seal band areas of the substrate essentially dissolves leaving only traces of a white residue of inorganic filler component of the adhesive on some areas of the substrate surface.

The substrate is then transported to a bath containing Methotate solvent which is preheated to a temperature of about 40–55° C. with constant agitation. After about 5–7 minutes the substrate is transferred to a second bath containing Methotate solvent which is also preheated to a temperature of about 40–55° C. with constant agitation. After about 5–7 minutes, followed by a rinse or spray, the substrate is transferred to a third bath containing IPA or aqueous IPA at room temperature in which the substrate is subjected to about 5–7 minutes of immersion rinse or spray rinse to replace the solvent carry-over with IPA. After the first IPA or aqueous IPA rinse, the ceramic substrate is subjected to a second rinse cycle with IPA by spray or immersion spray followed by drying with $N_2$ and vacuum bake if desired before reuse.

Visual and microscopic examination of the substrate surface after treatment with the above cleaning process showed no evidence of any Sylgard residue. A water contact angle test with the cleaned surface showed the surface to readily wet by water which is indicative of complete removal of hydrophobic silicon film. Surface analysis by x-ray photoelectron spectroscopy (XPS) of ceramic regions showed no change in the surface elemental composition in comparison to the ceramic substrate prior to the Sylgard rework process. Similarly, analysis of the metal pads on the top and the bottom side of the substrate showed no effect of the silicone residue removal process on the surface chemistry of the various metal features.

For a functional test, the reworked ceramic substrate was assembled with a metal protective cap by applying the Sylgard adhesive composition onto the bonding surfaces at the seal band areas of the two parts. The parts are assembled and the adhesive is cured by subjecting the assembly to the thermal curing temperature, of 170–175° C. for about 45–60 minutes. Shear strength measurements according to a standard tensile pull test showed high shear strength with no significant difference from the shear strength obtained with the assembly using a new substrate.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of removing cured silicone polymer deposits from electronic components comprising the sequential steps of:

immersing the electronic components in a preheated solution of 0.2 to 5.0 weight % quaternary ammonium fluoride in a hydrophobic non-hydroxylic aprotic solvent, wherein the hydrophobic non-hydroxylic aprotic solvent is propylene glycol alkyl ether alkoate, with agitation, for a first predetermined period of time;

immersing the electronic components in a preheated solvent consisting essentially of a hydrophobic non-hydroxylic aprotic solvent, wherein the hydrophobic non-hydroxylic aprotic solvent is propylene glycol alkyl ether alkoate, with agitation, for a second predetermined period of time;

immersing or rinsing or spraying the electronic components with a hydrophilic, essentially water soluble solvent, wherein the hydrophilic, essentially water soluble solvent comprises propylene glycol alkyl ethers, with agitation for about 5 to 10 minutes;

transporting the electronic components to an aqueous rinse bath and applying a water rinse; and drying the electronic components, wherein the cured silicone polymer deposits are removed.

2. The method of claim 1 further comprising the step of rinsing the electronic components with isopropanol (IPA) prior to said step of drying the electronic component, and further comprising the step of vacuum baking the electronic component after said drying step.

3. The method of claim 1 wherein said propylene glycol alkyl ether alkoate is selected from the group consisting of propylene glycol methyl ether acetate (PMA), propylene glycol ethyl ether acetate (PGEEA), propylene glycol methyl ether propionate (methotate), di(propylene glycol) methyl ether acetate (DPMA), ethoxy ethyl propionate (EEP), and di(propylene glycol) dimethyl ether (DMM).

4. The method of claim 1 where said quaternary ammonium fluoride (QAF) is a tetraalkylammonium fluoride represented by $R_1R_2R_3R_4N^+F^-xH_2O$ and an anhydrous solution in tetrahydrofuran (THF), where $R_1$, $R_2$, $R_3$, $R_4$ are the same or different and are selected from the group consisting of an organic radical $C_nH_{2n+1}$ with n=1–8.

5. The method of claim 1 where said quaternary ammonium fluoride is tetrabutylammonium fluoride hydrate represented by the formula $(Bu_4N^+F^-.xH_2O)$, where x=3–5.

6. The method of claim 1 wherein said quaternary ammonium fluoride comprises tetraalkyl ammonium fluorides of the type $R_4N^+F^-$, where R is a methyl, ethyl, n-propyl, isopropyl, n-butyl, or n-octyl group, and combination thereof.

7. The method of claim 1 where said solution of quaternary ammonium fluoride is 0.5–2.0 weight % based on a formula $R_1R_2R_3R_4\ N^+F^-$, where $R_1$, $R_2$, $R_3$, $R_4$ are the same or different and are selected from the group consisting of an organic radical $C_nH_{2n+1}$ with n=1–8.

8. The method of claim 1 wherein said preheated solution contains about 0.6% to about 1.5% (weight %) of tetrabutylammonium fluoride trihydrate (TBAF.3H2O) in said hydrophobic non-hydroxylic aprotic solvent.

9. The method of claim 1 wherein said preheated solution is heated to about 40° C. to about 90° C.

10. The method of claim 1 wherein said first predetermined period of time is about 10 minutes to about 90 minutes.

11. The method of claim 1 wherein said preheated solvent is at room temperature to about 70° C.

12. The method of claim 1 wherein said second predetermined period of time is about 5 minutes to about 15 minutes.

13. The method of claim 1 wherein said propylene glycol alkyl ethers are selected from the group consisting of di(propylene glycol) methyl ether (DPM), tri(propylene glycol) monomethy ether (TPM), tri(propylene glycol) n-propyl ether, or a mixture thereof.

14. The method of claim 1 wherein said hydrophilic, essentially water soluble solvent is at a temperature from about room temperature to about 60° C.

15. The method of claim 4 where said tetraalkyl ammonium fluoride is selected from the group consisting of tetrabutylammonium fluoride (TBAF), tetramethylammonium fluoride (TMAF), tetraethylammonium fluoride (TEAF), tetraisopropylammonium fluoride, tetra-n-octylammonium fluoride (TOAF), and mixtures thereof.

16. A method of removing cured silicone deposits from electronic components comprising the sequential steps of:

immersing the electronic components in a preheated solution of 0.2 to about 5 weight % quaternary ammonium fluoride in a hydrophobic non-hydroxylic aprotic solvent, wherein the hydrophobic non-hydroxylic aprotic solvent is propylene glycol alkyl ether alkoate, with agitation, for a first predetermined period of time, said preheated solution at a temperature of about 50° C. to about 60° C.;

immersing the electronic components in a first preheated hydrophobic non-hydroxylic aprotic solvent, wherein the hydrophobic non-hydroxylic aprotic solvent is propylene glycol alkyl ether alkoate, with agitation, for a second predetermined period of time, said first preheated hydrophobic non-hydroxylic aprotic solvent at a temperature of about 45° C. to about 60° C.;

immersing or rinsing or spraying the electronic components with a second preheated hydrophobic non-hydroxylic aprotic solvent, wherein the hydrophobic non-hydroxylic aprotic solvent is propylene glycol alkyl ether alkoate, with agitation, followed by a spray rinse;

applying a first rinse/spray to the electronic components with isopropanol (IPA) for about 5 minutes to about 10 minutes at room temperature;

applying a second rinse/spray to the electronic components with isopropanol (IPA); and drying the electronic components, wherein the cured silicone polymer deposits are removed.

17. The method of claim 16 wherein said preheated solution contains about 0.6 to about 1.5% (weight %) of tetrabutylammonium fluoride (TBAF) trihydrate $(Bu_4N^+F^-.3H_2O)$ in said hydrophobic non-hydroxylic aprotic solvent.

18. The method of claim 16 wherein said first predetermined period of time is about 15 minutes to about 35 minutes.

19. The method of claim 16 wherein said second predetermined period of time is about 5 minutes to about 10 minutes.

20. The method of claim 16 further comprising the step of vacuum baking the electronics component after said drying step.

* * * * *